(12) United States Patent
Li et al.

(10) Patent No.: US 7,743,315 B2
(45) Date of Patent: Jun. 22, 2010

(54) SYSTEM AND METHOD FOR LOW-DENSITY PARITY CHECK (LDPC) CODE DESIGN

(75) Inventors: Chuxiang Li, New York, NY (US);
Guosen Yue, Plainsboro, NJ (US);
Mohammad A. Khojastepour,
Plainsboro, NJ (US); Xiaodong Wang,
New York, NY (US); Mohammad Madihian, Plainsboro, NJ (US)

(73) Assignee: NEC Laboratories America, Inc.,
Princeton, NJ (US)

( * ) Notice: Subject to any disclaimer, the term of this patent is extended or adjusted under 35 U.S.C. 154(b) by 944 days.

(21) Appl. No.: 11/533,978

(22) Filed: Sep. 21, 2006

(65) Prior Publication Data
US 2007/0113146 A1    May 17, 2007

Related U.S. Application Data

(60) Provisional application No. 60/730,715, filed on Oct. 27, 2005.

(51) Int. Cl.
*H03M 13/00* (2006.01)
(52) U.S. Cl. .................................... 714/801
(58) Field of Classification Search ................. 714/746, 714/800–801, 807
See application file for complete search history.

(56) References Cited

U.S. PATENT DOCUMENTS

2005/0078765 A1* 4/2005 Jeong et al. ................. 375/267

OTHER PUBLICATIONS

Chen et al., Density evolution for two improved BP-based decoding algorithm of LDPC codes, May 2002, IEEE Comm. Letters vol. 6, No. 5, p. 208 to 210.*
Tan et al., Performance evaluation of Low density parity check codes on partial response channels using density evolution, Aug. 2004, IEEE Trans. On COmm., vol. 52, No. 8, p. 1253 to 1256.*
Ashikhmin, A. et al., "Extrinsic Information Transfer Functions; Model and Erasure Channel Properties", IEEE Transactions on Information Theory, vol. 50, No. 11, Nov. 2004.
Lou, H. et al., "Rate-Compatible Low-Density Generator Matrix Codes", 2005 Conference on Information Sciences and Systems, The Johns Hopkins University, Mar. 16-18, 2005.
Shokrollahi, A., "LDPC Codes: An Introduction", Digital Fountain, Inc., Apr. 2, 2003. Downloaded From www.ipm.ac.ir/IPM/homepage/Amin2.pdf on Sep. 20, 2006.
Chakrabarti, A. et al., "Low Density Parity Codes for the Relay Channel", Downloaded from www.ece.rice.edu/~ashu/publications/jsac06_arnab.pdf on Sep. 20, 2006.
Razaghi, P. et al., "Bilayer LDPC Codes for the Relay Channel", Downloaded from www.comm.utoronto.ca/~weiyu/BiLDPC_final4.pdf on Sep. 20, 2006.

* cited by examiner

*Primary Examiner*—Shelly A Chase
(74) *Attorney, Agent, or Firm*—Joseph J. Kolodka

(57) ABSTRACT

Disclosed is a density evolution algorithm based on a refined definition of node and edge densities for different parts of the code. In particular, density functions $f_V^{(1)}(i)$ and $f_V^{(2)}(i)$ of the output edges of the variable nodes with degree i within different codeword regions $w_1$ and $w_e$, respectively, are defined and then calculated. Further, density functions $f_C^{(1)}(j)$ and $f_C^{(2)}(j)$ of the output edges for check nodes with degree j within codeword regions $w_1$ and $w_e$, respectively, are defined and then calculated. Mixture density functions of output check edges connecting variable nodes in the first codeword region and the second codeword region are then calculated to determine an LDPC code design.

14 Claims, 10 Drawing Sheets

| STRUCTURE -1 | CODE-1 | CODE-2 | CODE-3 | CODE-4 | CODE-5 | CODE-6 | CODE-7 | CODE-8 |
|---|---|---|---|---|---|---|---|---|
| $\pi_1(i)$ | 0.5 | 0.5 | 0.5 | 0.5 | 0.5 | 0.5 | 0.5 | 0.5 |
| STRUCTURE -2 | CODE-1 | CODE-2 | CODE-3 | CODE-4 | CODE-5 | CODE-6 | CODE-7 | CODE-8 |
| $\pi_1(2)$ | 1 | 1 | 1 | 1 | 0.8579 | 0.8916 | 0.8228 | 0.8148 |
| $\pi_1(3)$ | 0.0745 | 0.0545 | | | | | | |
| STRUCTURE -3 | CODE-1 | CODE-2 | CODE-3 | CODE-4 | CODE-5 | CODE-6 | CODE-7 | CODE-8 |
| $\pi_1(2)$ | | | | | 0.1421 | 0.1084 | 0.1772 | 0.1852 |
| $\pi_1(3)$ | 0.9255 | 0.9455 | | | 1 | 1 | 1 | 1 |
| $\pi_1(4)$ | | | 1 | 1 | | 1 | | |
| $\pi_1(5)$ | 1 | | | | 1 | | | |
| $\pi_1(6)$ | 1 | 1 | | | 1 | | | |
| $\pi_1(7)$ | 1 | 1 | | | | | | |
| $\pi_1(8)$ | 1 | | 1 | | | | | |
| $\pi_1(9)$ | 1 | | | | | | | 1 |
| $\pi_1(10)$ | 1 | | | 1 | | | 1 | |
| $\pi_1(14)$ | | | | | | 1 | | |
| $\pi_1(20)$ | 1 | 1 | | | 1 | | | |
| $\pi_1(30)$ | 1 | | | | | | | |

SYSTEM AND METHOD FOR LOW-DENSITY PARITY CHECK (LDPC) CODE DESIGN

This application claims the benefit of U.S. Provisional Application No. 60/730,715 filed Oct. 27, 2005, which is incorporated herein by reference.

BACKGROUND OF THE INVENTION

The present invention relates generally to wireless communications, and more particularly to low-density parity check code design.

In wireless communications, a transmitter typically transmits information to a receiver over a communication channel. Statistically, a communication channel can be defined as a triple consisting of an input alphabet, an output alphabet, and for each pair (i,o) of input and output elements of each alphabet, a transition probability p(i,o). The transition probability is the probability that the receiver receives the symbol o given that the transmitter transmitted symbol i over the channel.

Given a communication channel, there exists a number, called the capacity of the channel, such that reliable transmission is possible for rates arbitrarily close to the capacity, and reliable transmission is not possible for rates above the capacity.

In some circumstances, the distance separating the transmitter (i.e., source) and the receiver (i.e., destination) is large. Alternatively or additionally, the communication channel over which the source and destination communicate may be poor quality. As a result, interference may be introduced in the communications between the source and the destination, which can result in distortion of the message.

To reduce the effect of interference, the transmitter and receiver often transmit information over a communication channel using a coding scheme. The coding scheme provides redundancy so that the message can be detected (and decoded) by the receiver in the presence of interference.

The coding scheme uses codes, which are an ensemble (i.e., group) of vectors that are to be transmitted by the transmitter. The length of the vectors are assumed to be the same and is referred to as the block length of the code. If the number of vectors is $K=2^k$, then every vector can be described with k bits. If the length of the vectors is n, then in n times use of the channel k bits have been transmitted. The code then has a rate of k/n bits per channel use, or k/n bpc.

Low-density parity check (LDPC) codes are a class of linear block codes that often approach the capacity of conventional single user communication channels. The name comes from the characteristic of their parity-check matrix, which contains only a few 1's in comparison to the amount of 0's. LDPC codes may use linear time complex algorithms for decoding.

Figure 1:
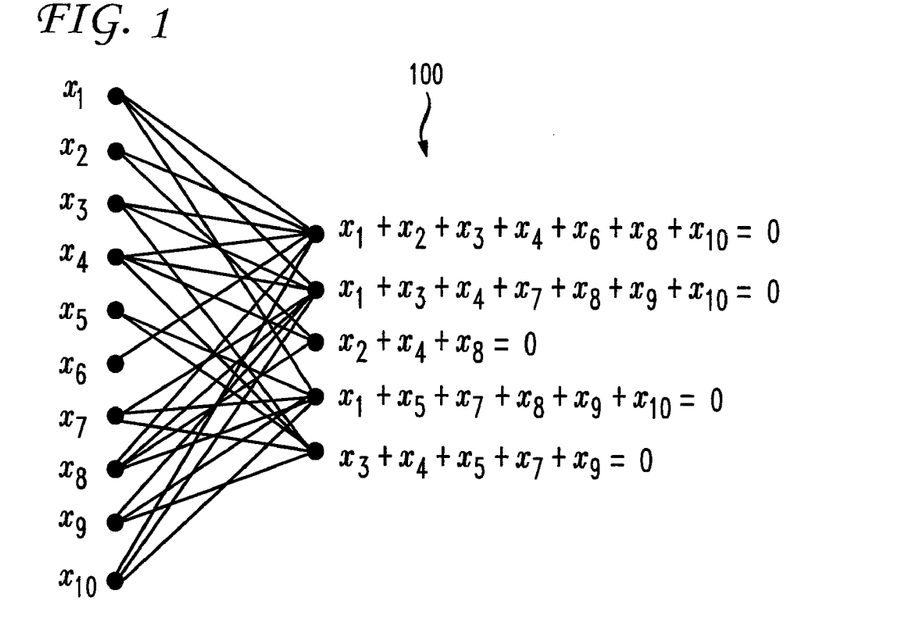
FIG. 1 shows a graph of a low-density parity check (LDPC) code.

In more detail, LDPC codes are linear codes obtained from sparse bipartite graphs. FIG. 1 shows a graph 100 of an LDPC code. The graph 100 has n left nodes (i.e., $x_1$ to $x_{10}$) (called message nodes) and m right nodes (called check nodes). The graph 100 gives rise to a linear code of block length n and dimension at least n−m in the following way: the m coordinates of the codewords are associated with the n message nodes. The codewords are those vectors $(c_1, \ldots, c_n)$ such that, for all check nodes, the sum of the neighboring positions among the message nodes is zero.

Thus, a binary LDPC code is a linear block code with a sparse binary parity-check matrix. This m×n parity check matrix can be represented by a bipartite graph (e.g., as shown in FIG. 1) with n variable nodes corresponding to columns (bits in the codeword) and m check nodes corresponding to rows (parity check equations). A one in a certain row and column of the parity check matrix denotes an edge between the respective check and variable node in the graph, whereas a zero indicates the absence of an edge.

An LDPC code ensemble is characterized by its variable and check degree distributions (or profiles) $\lambda = \lfloor \lambda_2 \ldots \lambda_{d_v} \rfloor$ and $\rho = \lfloor \rho_2 \ldots \rho_{d_c} \rfloor$, respectively, where $\lambda_i(\rho_i)$ denotes the fraction of edges connected to a variable (check) node of degree i, and $d_v(d_c)$ is the maximum number of edges connected to any variable (check) node. An equivalent representation of LDPC code profiles can use generating functions $$\lambda(x) = \sum_{i=2}^{d_v} \lambda_i x^{i-1},$$

$$\rho(x) = \sum_{i=2}^{d_c} \rho_i x^{i-1}.$$

The design rate of an ensemble can be given in terms of $\lambda(x)$ and $\rho(x)$ by $$R = 1 - \frac{m}{n} = 1 - \frac{\int_0^1 \rho(x) dx}{\int_0^1 \lambda(x) dx}$$

Even while using a coding scheme, a destination may not be able to detect the transmitted message because of interference. In this case, a relay node, such as another transmitter or receiver, may be used in a system to relay the information transmitted by the source to the destination. For example, a relay can receive $Y_1$ and send out $X_1$ based on $Y_1$.

Some methods have been introduced for the purpose of performance prediction of code ensembles, such as density evolution (DE) and extrinsic-mutual-information-transfer (EXIT). The design of rate compatible LDPC codes employing the conventional density evolution algorithm, however, typically considers extra constraints on the code ensembles due to the specific structure of rate compatible codes.

LDPC codes are designed for half-duplex relay networks. While the structure of LDPC codes for half-duplex relay networks are in part similar to rate compatible code structures, current design methods based on Guassian approximation of density are typically not directly applicable to the problem of half-duplex relay channel code design because of a variation of receive signal to noise ratios (SNRs) in different sub-blocks of one codeword.

Therefore, there remains a need to design a LDPC code for a half-duplex relay channel that applies to the variation of SNRs in different sub-blocks of one codeword.

SUMMARY OF THE INVENTION

A density evolution algorithm is based on introducing a refined definition of node and edge densities for the different parts of a code in accordance with an embodiment of the present invention. In particular, density functions $f_V^{(1)}(i)$ and $f_V^{(2)}(i)$ of the output edges of the variable nodes with degree i within different regions $w_1$ and $w_e$, respectively, are defined. Further, density functions $f_C^{(1)}(j)$ and $f_C^{(2)}(j)$ of the output edges for check nodes with degree j within codeword regions $w_1$ and $w_e$, respectively, are defined.

In one embodiment, the extra constraint posed on these densities because of the structure of the half-duplex relay channel codes are considered. This set of constraints can introduce new relations between the four functions $f_V^{(1)}(i)$, $f_V^{(2)}(i)$, $f_C^{(1)}(j)$, and $f_C^{(2)}(j)$ that are in addition to the normal constraint on the density function based on the code rate.

The variable node density functions $f_V^{(1)}(i)$ and $f_V^{(2)}(i)$ and the check node density functions $f_C^{(1)}(j)$ and $f_C^{(2)}(j)$ within the first codeword region and the second codeword region are calculated. Mixture density functions of output check edges connecting variable nodes in the first codeword region and the second codeword region are calculated to determine an LDPC code design. If a signal to noise ratio (SNR) of the first codeword region is different than a SNR of the second codeword region, then $$f_V^{(1)}(i) \neq f_V^{(2)}(i) \text{ for each } i \text{ and } f_C^{(1)}(j) \neq f_C^{(2)}(j) \text{ for each } j.$$

$\{\lambda_i\}_i$, is denoted as the variable edge distribution and $\{\rho_j\}_j$ is denoted as the check edge distribution of entire code $w_2$. $m_0^{(1)}$ and $m_0^{(2)}$ are denoted as the output means from the channel detectors of $w_1$ and $w_e$, respectively. $N(m, 2m)$ is denoted as the probability density function (pdf) of a symmetric Gaussian distribution with the mean $m$ and the variance $2m$. $m_C^{(1)} = m_C^{(2)} = 0$ for all $i$.

The variable node density functions within $w_1$ and $w_e$, respectively, are calculated by:

$$f_V^{(1)}(i) = N(\underbrace{m_0^{(1)} + (i-1)m_C^{(1)}}_{m_V^{(1)}(i)}, 2(m_0^{(1)} + (i-1)m_C^{(1)}))$$

$$= N(m_V^{(1)}(i), 2m_V^{(1)}(i))$$

$$f_V^{(2)}(i) = N(\underbrace{m_0^{(2)} + (i-1)m_C^{(2)}}_{m_V^{(2)}(i)}, 2(m_0^{(2)} + (i-1)m_C^{(2)}))$$

$$= N(m_V^{(2)}(i), 2m_V^{(2)}(i)).$$

Further, the check node density functions are determined by calculating $f_C^{(1)}(i) = N(m_C^{(1)}(i), 2m_C^{(1)}(i))$ and $f_C^{(2)}(i) = N(m_C^{(2)}(i), 2m_C^{(2)}(i))$, respectively, using $$m_C^{(1)}(i) = \psi^{-1}\left(\left[\psi\left(\sum_j \lambda_j^{(1)} m_V^{(1)}(i)\right)\right]^{d_{i,1}-1}\left[\psi\left(\sum_j \lambda_j^{(2)} m_V^{(2)}(i)\right)\right]^{d_{i,2}}\right)$$

and $$m_C^{(2)}(i) = \psi^{-1}\left(\left[\psi\left(\sum_j \lambda_j^{(1)} m_v^{(1)}(i)\right)\right]^{d_{i,1}}\left[\psi\left(\sum_j \lambda_j^{(2)} m_v^{(2)}(i)\right)\right]^{d_{i,2}-1}\right)$$

where $\psi(x) \int \{\tanh(y/2)\} p_y(y) dy$ with $p_y(y) \sim N(x, 2x)$; $d_1(i) = iP_1$ and $d_2(i) = i(1-P_1)$ with $P_1$ denoting the ratio of the number of variable nodes in $w_1$ over the number of variable nodes in the entire node $w_2$; $\{\lambda_j^{(1)}\}_j$ denotes the variable edge distribution of the code $w_1$; $\{\lambda_j^{(2)}\}_j$ denotes the variable edge distribution of the code $w_e$.

Mixture density functions of the output check edges connecting the variable nodes in $w_1$ and $w_e$ are calculated as:

$$f_C^{(l)} = \sum_i \rho_i N(m_C^{(l)}(i), 2m_C^{(l)}(i)) = N(m_C^{(l)}, 2m_C^{(l)}), l=1,2$$

where $\{\rho_i\}_i$ denotes the overall edge distribution of the check nodes.

These and other advantages of the invention will be apparent to those of ordinary skill in the art by reference to the following detailed description and the accompanying drawings.

DETAILED DESCRIPTION

Figure 2A:
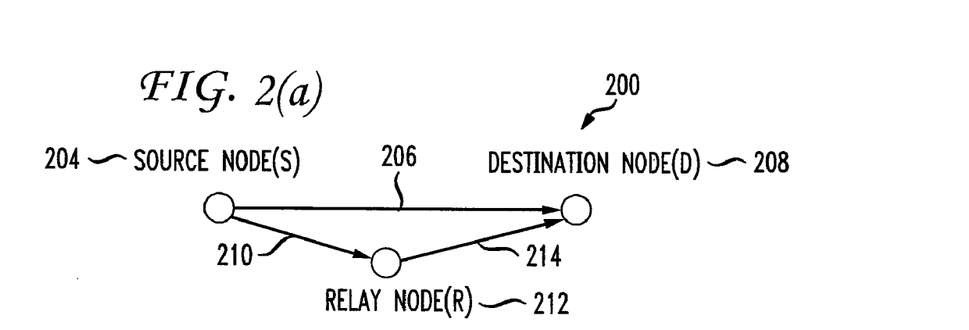
FIG. 2(a) shows full-duplex relay operations of a single relay system during a single time slot.

FIG. 2(a) shows full-duplex relay operations of a single relay system 200 during a single time slot. In particular, a source node, or source S, 204 communicates a message 206 to a destination node, or destination D, 208 during a time slot. The source 204 also communicates the message 210 to a relay node, or relay, 212. The relay 212 communicates the same message (shown with arrow 214) to the destination 208. Because the system 200 is a full-duplex relay system, the relay 212 can receive the message 210 from the source 204 and simultaneously transmit the message 214 to the destination 208. The source 204, relay 212, and destination 208 can be wireless terminals in a wireless network.

Figure 2B:
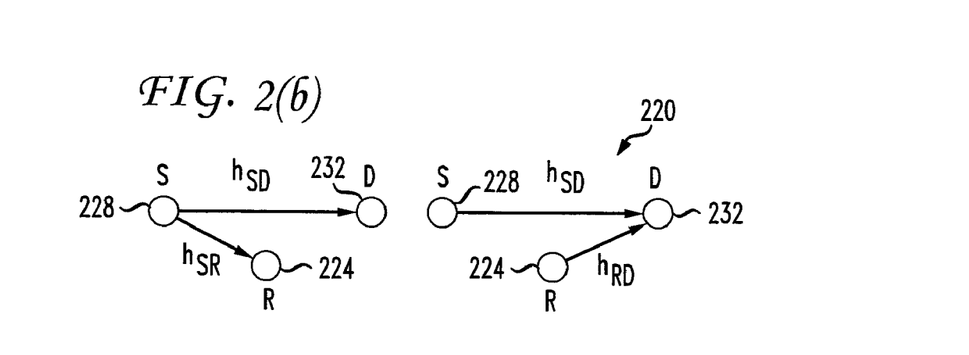
FIG. 2(b) shows half-duplex relay operations of a single relay system during two consecutive time slots.

FIG. 2(b) shows half-duplex relay operations of a single relay system 220 during two consecutive time slots. Specifically, the left side of FIG. 2(b) shows the operations within the odd time slot and the right side of FIG. 2(b) shows the operation within the even time slot. During the odd time slot, the relay R 224 and the destination D 232 each receive signals from the source S 228. During the even time slot, the relay R 224 and the source S 228 each transmit signals to the destination D 232.

Denote $x_S$ and $x_R$ as the signals transmitted from S 228 and R 224, respectively. Further (and as shown in FIG. 2(b)), denote $h_{SD}$, $h_{SR}$, and $h_{RD}$ as the path (i.e., channel) gains between {S, D}, {S, R} and {R, D}, respectively.

Figure 3:
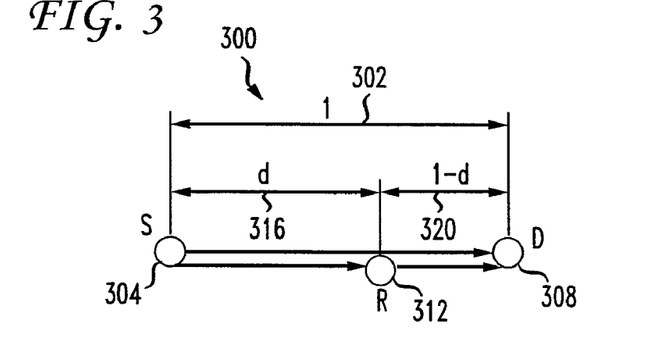
FIG. 3 shows a one-dimensional channel model for the single relay system of FIG. 2(b)

FIG. 3 shows a one-dimensional channel model 300 for the single relay system of FIG. 2(b). The distance 302 between S 304 and D 308 is normalized to unity. The distance between source S 304 and relay R 312 is denoted by d 316 and the distance between relay R 312 and the destination D 308 is 1−d 320. The channel gain depends on large scale path loss, $$|h_{SR}|^2 = \frac{1}{d^\alpha}, |h_{SD}|^2 = 1,$$

and $$|h_{RD}|^2 = \frac{1}{(1-d)^\alpha},$$

where $\alpha \in (2, 5)$ is the path loss exponent. The channel gains ($h_{SR}$, $h_{SD}$, and $h_{RD}$) may remain invariant over time. Then the received signal at the relay during each odd time slot can be written as:

$$y_R(2t-1) = h_{SR} x_S(2t-1) + n_R(2t-1), \quad (1)$$

and the received signals at the destination during two consecutive time slots are given by:

$$y_D(2t-1) = h_{SD} x_S(2t-1) + n_D(2t-1), \quad (2)$$

$$y_D(2t) = h_{SD} x_S(2t) + h_{RD} x_R(2t) + n_D(2t), \quad (3)$$

where $n_R$, $n_D \sim N(0, N_0)$ denote the additive white Gaussian noise (AWGN) at the relay and the destination, respectively. $N_0$ denotes the AWGN variance. N denotes Gaussian distribution, i.e., $n_R$, $n_D \sim N(0, N_0)$ indicates that the noises $n_R$ and $n_D$ both follow the Gaussian distribution with zero mean and variance $N_0$.

Figure 4A:
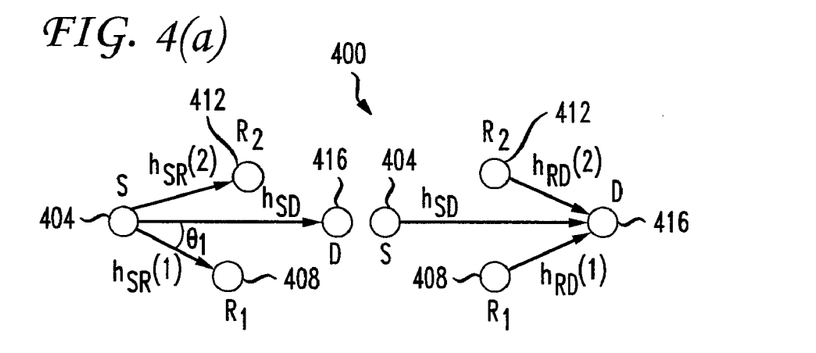
FIG. 4(a) shows a two relay system operating in half-duplex relay mode during two consecutive time slots.

FIG. 4(a) shows a two relay system 400 operating in half-duplex relay mode during two consecutive time slots. In particular, during an odd time slot, source S 404 transmits a signal to a first relay $R_1$ 408 and another signal to a second relay $R_2$ 412. The source S 404 also transmits a signal to the destination D 416. During an even time slot, source S 404 transmits a signal to the destination D 416 while each relay $R_1$ 408 and $R_2$ 412 transmits its signal to the destination D 416.

In a K-relay system, denote $x_R^{(i)}$ as the signal transmitted from relay i ($R_i$), and $h_{SR}^{(i)}$ and $h_{RD}^{(i)}$ as the channel gains from $R_i$ to S 404 and D 416, respectively, $1 \leq i \leq K$. Then the received signal at $R_i$ is given by $$y_R^{(i)}(2t-1) = h_{SR}^{(i)} x_S(2t-1) + n_R(2t-1), 1 \leq i \leq K. \quad (4)$$

The received signal at D 416 during the odd time slot is the same as equation (2) above, and that during the even time slot the received signal can be rewritten from equation (3) into:

$$y_D(2t) = h_{SD} x_S(2t) + \sum_{i=1}^{K} h_{RD}^{(i)} x_R^{(i)}(2t) + n_D(2t). \quad (5)$$

Figure 4B:
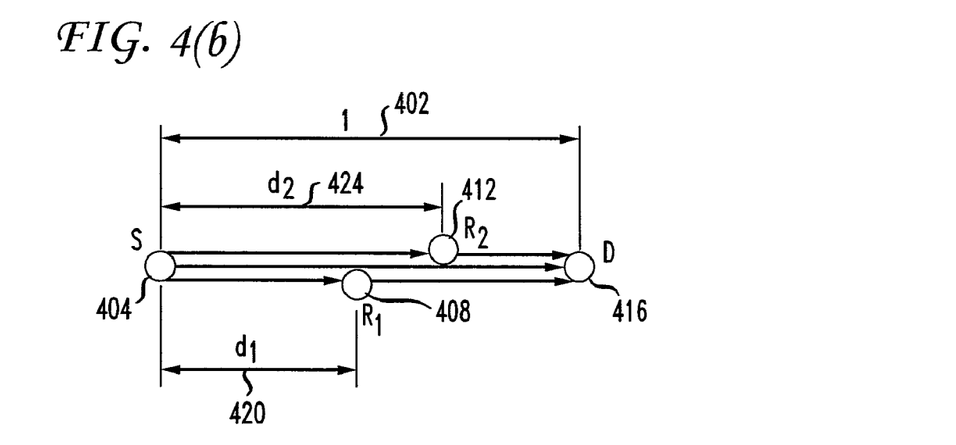
FIG. 4(b) shows a two-dimensional channel model for the multiple relay system of FIG. 4(a)

FIG. 4(b) shows the two-dimensional channel model for the multiple relay system 400 of FIG. 4(a). The model shows that the distance 402 between the source S 404 and the destination D 416 has been normalized to unity. The distance between the source S 404 and the first relay $R_1$ 408 is $d_1$ 420 and the distance between the source S 404 and the second relay $R_2$ 412 is $d_2$ 424.

Note that the position of each relay i depends on ($d_i$, $\theta_i$), where $d_i$ is the distance between relay i and the source S 404, and $\theta_i$ is the corresponding angle between the relay i and the source S 404 (e.g., $\theta_1$ is the angle between the source S 404 and the first relay $R_1$ 408, shown in FIG. 4(a)). The channel gains in the two-relay system shown in FIG. 4(a) can be written as $|h_{SR}^{(i)}|^2 = 1/d_i^\alpha$, $|h_{SD}|^2 = 1$, and $|h_{RD}^{i}|^2 = 1/[(d_i \sin(\theta_i))^2 + (1 - d_i \cos(\theta_i))^2]^{\alpha/2}$.

Relay Protocol for Half-Duplex Relay Systems

Relay protocols, which describe how to allocate space-time resources to achieve cooperative transmissions, are typically crucial for relay systems and the corresponding code design. In one embodiment, a code design for the half-duplex relay channel involves the design of two different sets of codebooks, one for the source ($x_S(2t-1)$ and $x_S(2t)$) and the other for the relay ($x_R(2t)$), where t represents the time slot. In one embodiment, the coding and decoding strategy is performed over multiple blocks.

During the odd time slot, the source transmits a LPDC codeword $w_1$, i.e., $x_S(2t-1) = \sqrt{P_{S,1}} w_1$ where $E\{\|w_1\|^2\} = 1$. $P_{S,1}$ represents the transmit power of the source node during the time 2t−1. $E\{.\}$ indicates the expectation operation. The two bars on each side of $w_1$ represent the norm of $w_1$. In the case that the destination cannot successfully decode $w_1$, the relay attempts to decode $w_1$ using equation (1) or (4) above. Then, the source and the relay cooperatively transmit some signals related to $w_1$ during the even time slot. Assuming perfect decoding at the relay, both the source and the relay transmit the same bits $w_e$ during the even time slot, i.e., $$x_S(2t) = \sqrt{P_{S,2}} w_e \text{ and } x_R^{(i)}(2t) = \sqrt{P_R^{(i)}} w_e, 1 \leq i \leq K, \text{ where } E\{\|w_e\|^2\} = 1.$$

Then the received signals at the destination during the even time slot (i.e., equations (3) and (5)) can be rewritten as:

$$y_D(2t) = \underbrace{\left( h_{SD} \sqrt{P_{S,2}} + \sum_i h_{RD}^{(i)} \sqrt{P_R^{(i)}} \right)}_{\tilde{h}_{SD}} w_e + n_D(2t) \quad (6)$$

$$= \tilde{h}_{SD} w_e + n_D(2t).$$

Figure 5A:
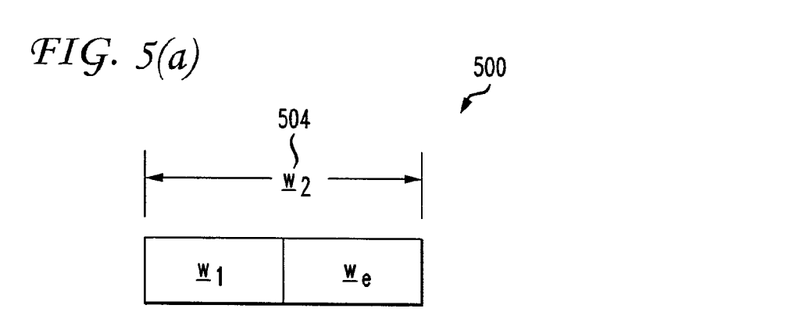
FIG. 5(a) is a block diagram of the relay protocol and a corresponding half-duplex relay code.
Figure 5B:
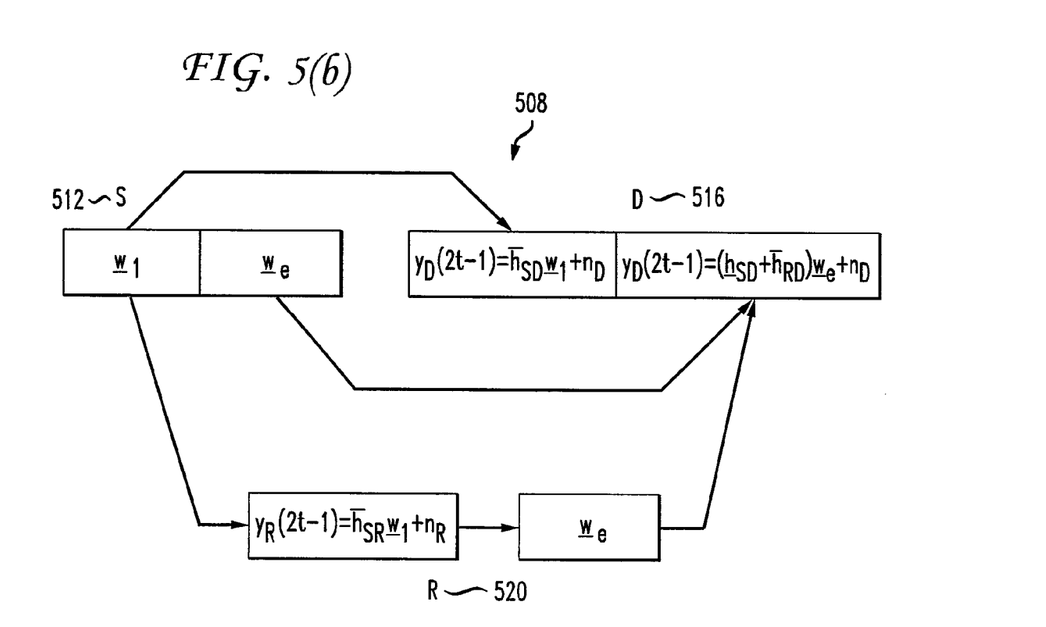
FIG. 5(b) is a block diagram of a half-duplex relay protocol and a corresponding coding strategy.

FIG. 5(a) is a block diagram 500 of the relay protocol and the corresponding half-duplex relay code $w_2$ 504. $w_2 = [w_1, w_e]$, which is an extended LDPC code of the original codeword $w_1$. FIG. 5(b) is a block diagram 508 of the half-duplex relay protocol and the corresponding coding strategy. The coding strategy is as follows:

$$\tilde{h}_{SD} = h_{SD} \sqrt{P_{S,1}}, \underline{h}_{SD} = h_{SD} \sqrt{P_{S,2}}, \tilde{h}_{SR} = h_{SR} \sqrt{P_{S,1}} \text{ and } \tilde{h}_{RD} = h_{RD} \sqrt{P_R}.$$

Source S 512 transmits codeword $w_1$ to destination D 516 and relay R 520. Source S 512 also transmits codeword $w_e$ to the destination D 516. Relay R 520 also transmits codeword $w_e$ to destination D 516. Successful decoding of $w_1$ may be achieved at the relay even when decoding fails at the destination because $|h_{SR}^{(i)}|^2 > |h_{SD}|^2$ due to $d_i < 1$, $1 \leq i \leq K$.

The code structure shown in FIG. 5($a$) illustrates the rate-compatible property of the half-duplex relay code $w_2$. The design of $w_2$ can, therefore, be categorized into the scenario of the rate-compatible code design, i.e., to find the optimum codeword $w_2 = [w_1, w_e]$ as an extended codeword of the original codeword $w_1$ with extended bits $w_e$.

Figure 6A:
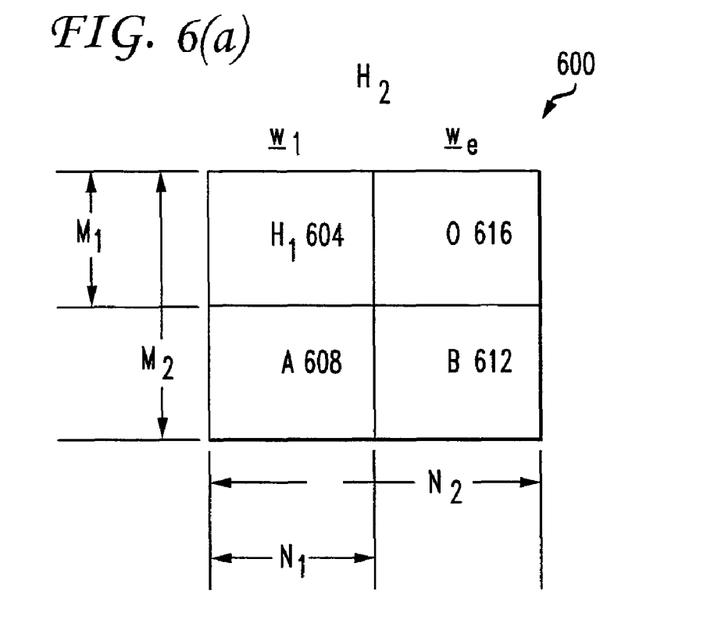
FIG. 6(a) is a block diagram of a rate-compatible structure of a parity-check matrix for half-duplex relay codes.

FIG. 6($a$) is a block diagram of a rate-compatible structure of the parity-check matrix 600 $H_2$ for half-duplex relay codes. The information of $w_2$ is carried in $w_1$, and $w_e$ contains some additional parity-check bits. Consequently, the parity-check matrix $H_2$ 600 for the entire codeword $w_2$ contains the parity-check matrix for $w_1$, $H_1$ 604, as the non-zero sub-matrix in the top-left location, A 608 and B 612 as the non-zero sub-matrices in the bottom, and O 616 as the zero sub-matrix in the top-right location. $M_1$ represents the number of rows in the parity check matrix $H_1$, i.e., the number of the check nodes in code $w_1$; $N_1$ represents the number of columns in $H_1$, i.e., the number of variable nodes in code $w_1$ and also the length of code $w_1$. Similarly, $M_2$ represents the number of rows in the parity check matrix $H_2$, i.e., the number of the check nodes in code $w_2$; $N_2$ represents the number of columns in $H_2$, i.e., the number of variable nodes in code $w_2$ and also the length of code $w_2$.

Unlike typical rate-compatible LDPC code design, the received SNRs for $w_1$ and $w_e$ are, in general, different according to the received signals at the destination (as described in equations (2) and (6) above). Specifically, the SNRs for the decoding of $w_1$ and $w_e$ can be written, respectively, as:

$$\gamma_1 = \frac{|h_{SD}|^2 P_{S,1}}{N_0}, \quad (7)$$

and $$\gamma_2 = \frac{\left(h_{SD}\sqrt{P_{S,2}} + \sum_i h_{RD}^{(i)} \sqrt{P_R^{(i)}}\right)^2}{N_0}, \quad (8)$$

where the transmit power constraint is given by $$P_{S,1} + P_{S,2} + \sum_{i=1}^{K} P_R^{(i)} \leq P_T$$

with a maximum overall transmit power denoted by $P_T$.

Thus, the half-duplex relay code design problem can be reformulated as the design of the rate-compatible LDPC code $w_2$ for a given original LDPC code $w_1$, where the received SNRs are $\gamma_1$ and $\gamma_2$ for $w_1$ and $w_e$, respectively.

The half-duplex relay code optimization algorithm is described below under a given power allocation set, where $R_2 < R_1$ (i.e., the rate of the second codeword is greater than the rate of the first codeword).

Code Ensemble for Half-Duplex Relay LDPC Codes

A parity-check matrix describes the corresponding LDPC codeword. The code ensemble (i.e., edge distribution or node perspective) can be used to statistically characterize a set of codewords with different parity-check matrices which share the same edge distribution, and thus, approximately have the same performance. In the above ensemble analysis, the SNR within one entire codeword is the same or the averaged SNRs within different regions of one codeword are statistically the same (e.g., which can be applied in block-fading or fast-fading channels).

A half-duplex relay codeword typically experiences different received SNRs within different regions, e.g., $\gamma_1 \neq \gamma_2$ for $w_1$ and $w_e$ as indicated by equations (7) and (8) above. The overall edge distribution is often too rough for the existing ensemble analysis methods to evaluate a half-duplex relay codeword.

Figure 6B:
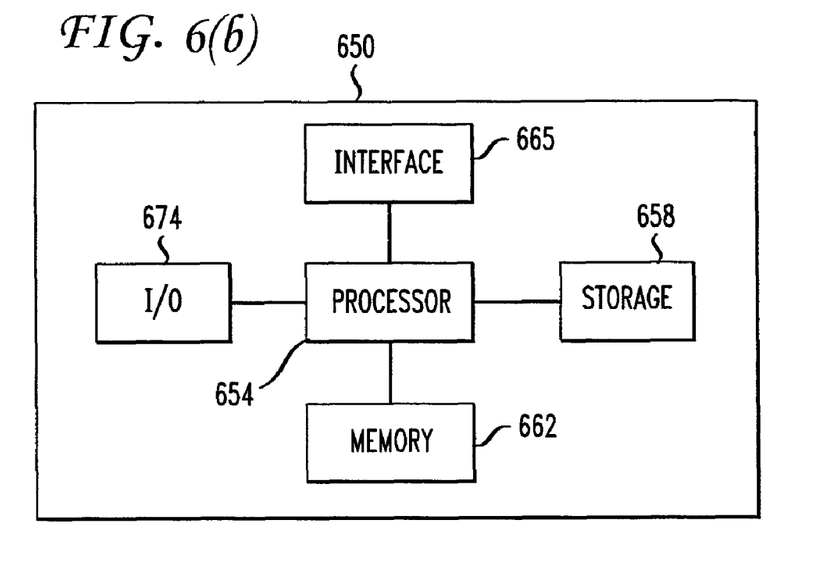
FIG. 6(b) shows a high level block diagram of a computer system which may be used in an embodiment of the invention.

The following description describes the present invention in terms of the processing steps required to implement an embodiment of the invention. These steps may be performed by an appropriately programmed computer, the configuration of which is well known in the art. An appropriate computer may be implemented, for example, using well known computer processors, memory units, storage devices, computer software, and other nodes. A high level block diagram of such a computer is shown in FIG. 6($b$). Computer 650 contains a processor 654 which controls the overall operation of computer 650 by executing computer program instructions which define such operation. The computer program instructions may be stored in a storage device 658 (e.g., magnetic disk) and loaded into memory 662 when execution of the computer program instructions is desired. Computer 650 also includes one or more interfaces 665 for communicating with other devices (e.g., locally or via a network). Computer 650 also includes input/output 674 which represents devices which allow for user interaction with the computer 650 (e.g., display, keyboard, mouse, speakers, buttons, etc.). The computer 650 may represent a relay, source, or destination as described above.

One skilled in the art will recognize that an implementation of an actual computer will contain other elements as well, and that FIG. 6($b$) is a high level representation of some of the elements of such a computer for illustrative purposes. In addition, one skilled in the art will recognize that the processing steps described herein may also be implemented using dedicated hardware, the circuitry of which is configured specifically for implementing such processing steps. Alternatively, the processing steps may be implemented using various combinations of hardware and software. Also, the processing steps may take place in a computer or may be part of a larger machine.

In accordance with an embodiment of the present invention, let $D_V^{(k)}$ and $D_C^{(k)}$ be the maximum degrees of the variable nodes and the check nodes, respectively, for the code $w_k$, k=1 and 2. Denote $\{\lambda_{i,k}\}_{i=1}^{D_V^{(k)}}$ and $\{\rho_{i,k}\}_{i=1}^{D_C^{(k)}}$ as the variable edge distribution and the check edge distribution, respectively. Further, denote $\{\alpha_{i,k}\}_{i=1}^{D_V^{(k)}}$ and $\{b_{i,k}\}_{i=1}^{D_C^{(k)}}$ as the variable node perspective and the check node perspective, respectively. Suppose that one half-duplex relay codeword experiences two different SNRs within two regions as FIG. 6($a$) shows ($\gamma_1 \neq \gamma_2$). For the code $w_2$, the following new ensemble definitions apply.

Define $\pi_1(i)$ as the probability of a variable node which has a degree of i and falls in the region of $w_1$ (i.e., H1 and A), namely region-1. Consequently, $\pi_2(i) = 1 - \pi_1(i)$ denotes the probability of the node falling in the region of $w_e$ (i.e., B and O), namely, region-2. The probability set $\{\pi_1(i), \pi_2(i)\}_{i=2}^{D_V^{(2)}}$ may satisfy the following constraint:

$$\sum_{i=1}^{D_V^{(2)}} \pi_1(i)a_{i,2} = \frac{R_2}{R_1} \text{ or } \sum_{i=1}^{D_V^{(2)}} \pi_2(i)a_{i,2} = 1 - \frac{R_2}{R_1}, \quad (9)$$

where $R_I$ denotes the rate of $w_I$, I=1, 2. The edge distribution is then defined within region-I, I=1 and 2, as $\{\lambda_{i,2}^{(I)}, \iota=1, 2\}_{i=1}^{D_V^{(2)}}$ where $$\lambda_{i,2}^{(I)} = \frac{\pi_I(i)\lambda_{i,2}}{\sum_{j=1}^{D_V^{(2)}} \pi_I(j)\lambda_{j,2}}, I = 1, 2. \quad (10)$$

The code ensemble of $w_2$ $\{\{\lambda_{i,2}^{(1)}, \lambda_{i,2}^{(2)}\}_{i=2}^{D_V^{(2)}}, \{\rho_{j,2}\}_{j=2}^{D_C^{(2)}}\}$ depends on the overall code ensemble $\{\{\lambda_{i,2}\}_i, \{\rho_{j,2}\}_j\}$ and the node probability set $\{\pi_1(i), \pi_2(i)\}_{i=2}^{D_V^{(2)}}$. Then, for each overall code ensemble $\{\{\lambda_{i,2}\}_i, \{\rho_{j,2}\}_j\}$, there may be a number of possible new code ensembles $\{\{\lambda_{i,2}^{(1)}, \lambda_{i,2}^{(2)}\}_i, \{\rho_{j,2}\}_j\}$, each of which can be determined by one node probability set $\{\pi_1(i), \pi_2(i)\}_i$. The code ensemble described in equation (10) describes the parity-check matrix of $w_2$ such that the edge distributions within region-1 and region-2 can be characterized separately. The half-duplex relay codewords with the same overall code ensemble $\{\{\lambda_{i,2}\}_i, \{\rho_{j,2}\}_j\}$ but different probability set $\{\pi_1(i), \pi_2(i)\}_i$ typically have different performances.

In one embodiment, the probability of a check node with a certain degree may fall within different non-zero sub-matrices $H_1$, A, and B, which may present a more detailed description of $H_2$. Note that $\{\{\lambda_{i,2}^{(1)}, \lambda_{i,2}^{(2)}\}_i, \{\rho_{j,2}\}_j\}$ can offer a more refined description of $w_2$ than $\{\{\lambda_{i,2}\}_i, \{\rho_{j,2}\}_j\}$.

Figure 7A:
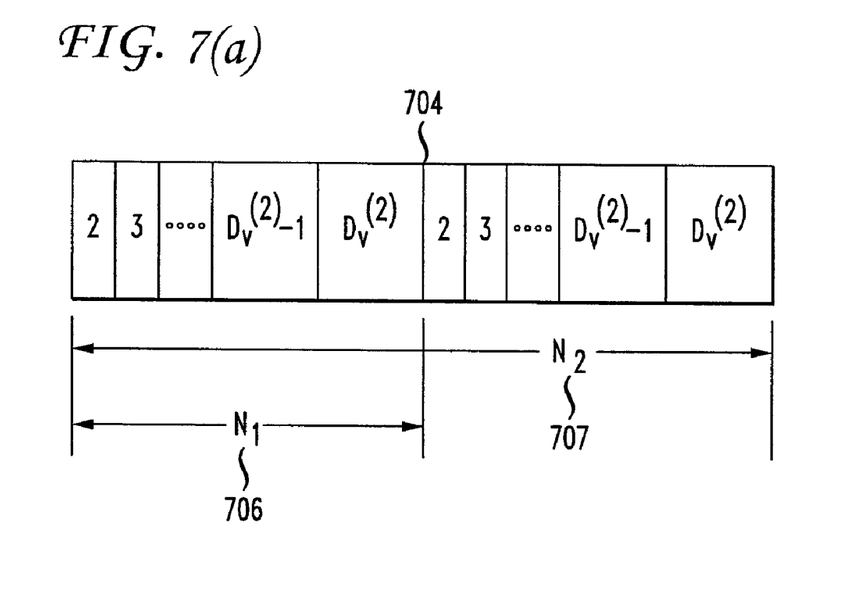
FIG. 7(a) is a block diagram of a parity-check matrix in accordance with an embodiment of the invention.
Figure 7B:
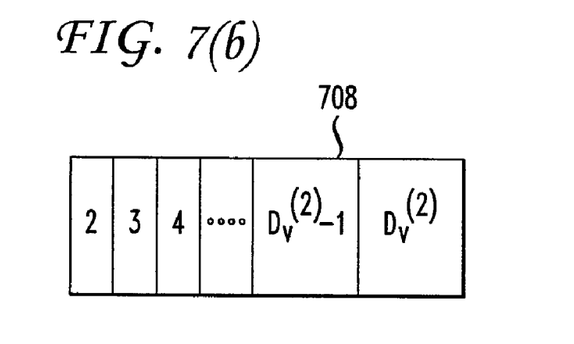
FIG. 7(b) is a block diagram of a parity-check matrix that shows an increasing degree of variable nodes in accordance with an embodiment of the invention.
Figure 7C:
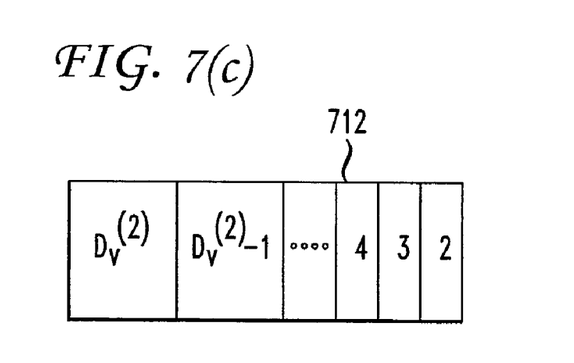
FIG. 7(c) is a block diagram of a parity-check matrix that shows a decreasing degree of variable nodes in accordance with an embodiment of the invention.

The following are examples to clarify the definition described in equation (10) above. Given each overall edge distribution, the node probability set may satisfy equation (9) in three different manners so that three different code ensembles can be obtained using equation (10). FIG. 7(a) is a block diagram of a parity-check matrix 704 that shows a proportional node distribution for each degree. FIG. 7(b) is a block diagram of a parity-check matrix 708 that shows an increasing degree of variable nodes. FIG. 7(c) is a block diagram of a parity-check matrix 712 that shows a decreasing degree of variable nodes.

Specifically, FIG. 7(a) shows the first manner of the node probability setting:

$$\pi_1(i) = \frac{R_2}{R_1}, 1 \le i \le D_V^{(2)}, \quad (11)$$

where the nodes with each degree are arranged proportionally in region-1 $N_1$ 706 and region-2 $N_2$ 707. FIG. 7(b) shows the second manner of the node probability setting:

$$\begin{cases} \pi_1(i) = 1, & 1 \le i \le K, \\ \pi_1(i) = \dfrac{R_2/R_1 - \sum_{j=1}^{i-1} a_{j,2}}{a_{i,2}}, & i = K+1 \\ \pi_1(i) = 0, & K+2 \le i \le D_V^{(2)}, \end{cases} \quad (12)$$

where the variable nodes in the parity-check matrix 708 is arranged from left to right in a non-decreasing degree order. FIG. 7(c) shows the third manner of the node probability setting:

$$\begin{cases} \pi_1(i) = 0, & 1 \le i \le L, \\ \pi_1(i) = \dfrac{R_2/R_1 - \sum_{j=i+1}^{D_V^{(2)}} a_{j,2}}{a_{L+1,2}}, & i = L+1 \\ \pi_1(i) = 1, & L+2 \le i \le D_V^{(2)}, \end{cases} \quad (13)$$

where the variable nodes in the parity-check matrix 712 are arranged from left to right in a non-increasing degree order.

Figure 8:
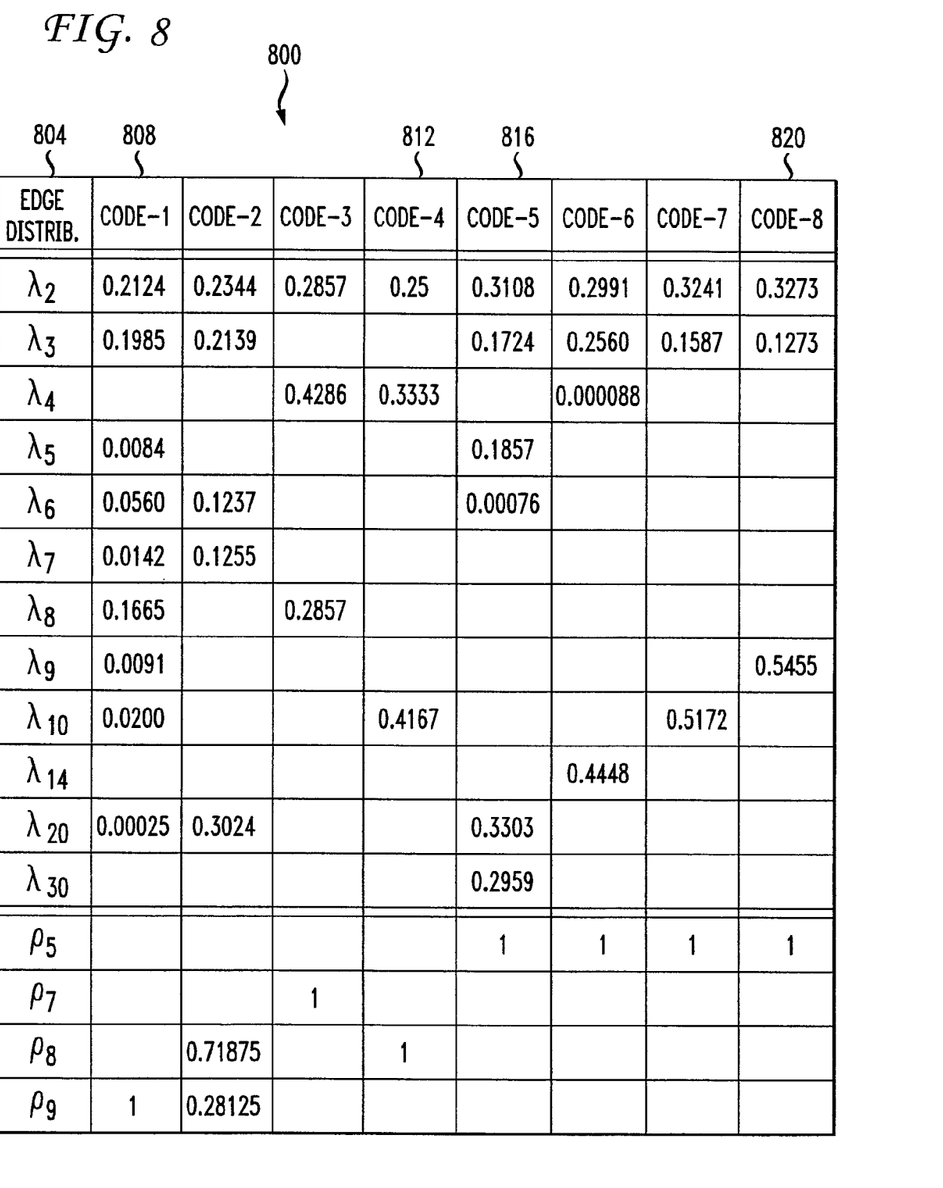
FIG. 8 is a table of overall edge distributions of the LDPC codes with different rates for additive white Gaussian noise (AWGN) channels in accordance with an embodiment of the invention.

FIG. 8 shows a table 800 of overall edge distributions 804 $\{\{\lambda_{i,2}\}_i, \{\rho_{j,2}\}_j\}$ of the LDPC codes with different rates for AWGN channels. In one embodiment, code-1 808~code-4 812 with ½ rate. Code-5 816~code-8 820 with ¼ rate.

Figure 9:
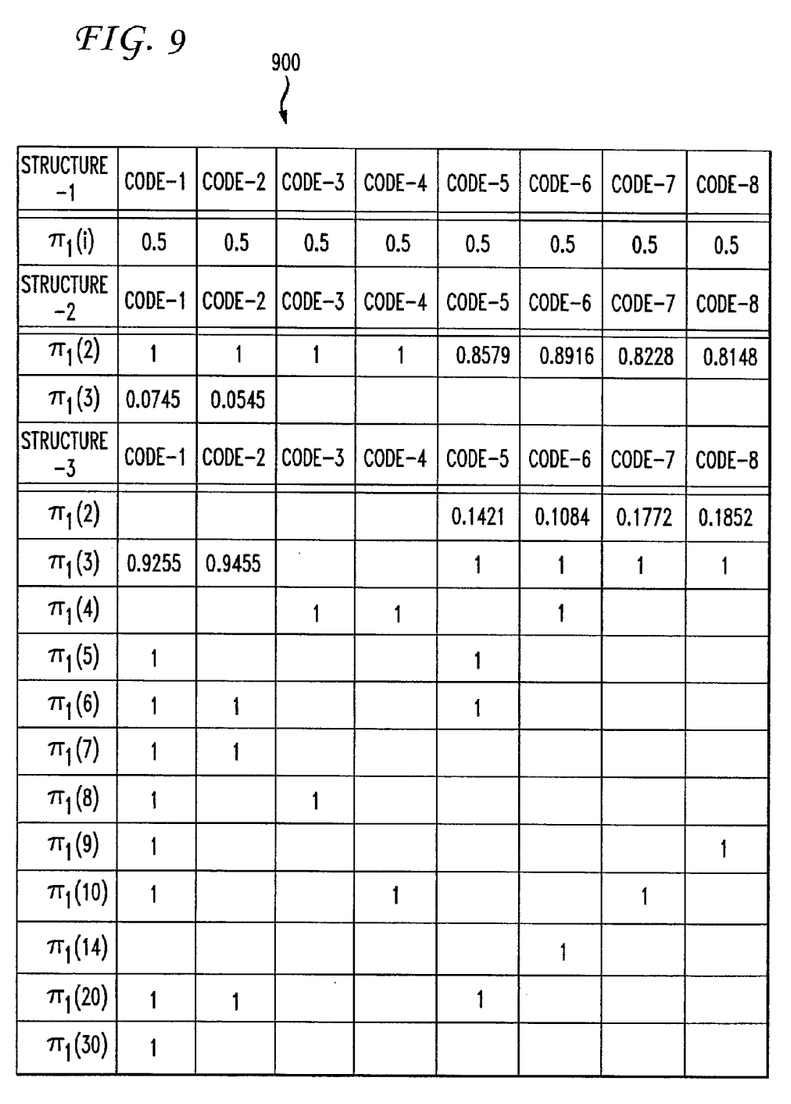
FIG. 9 shows a table of node probability sets with different structures of parity-check matrices in accordance with an embodiment of the invention.

FIG. 9 shows a table 900 of node probability sets with different structures of parity-check matrices. In particular, table 900 shows $\{\pi_1(i)\}_i$ corresponding to the three parity-check matrix structures shown in FIGS. 7(a), 7(b), and 7(c) for each of the overall edge distributions in FIG. 8.

Ensemble Performance Analysis for Half-Duplex Relay Codes

Because $\gamma_1 \ne \gamma_2$ in $w_2$ in the half-duplex relay scenario, common methods like density evolution or EXIT chart based on Gaussian approximation are typically not accurate in performance prediction based on the overall edge distribution $\{\{\lambda_{i,2}\}_i, \{\rho_{j,2}\}_j\}$. An iterative approach performed by the processor 654 to evaluate the half-duplex relay code based on the code ensemble $\{\{\lambda_{i,2}^{(1)}, \lambda_{i,2}^{(2)}\}_i, \{\rho_{j,2}\}_j\}$ is described below. A difference between this approach and the conventional density evolution approaches is that, instead of assuming equal density function for the entire codeword, different density functions are treated differently for the two different region-I, I=1, 2.

Variable Node Decoding Process

Figure 10:
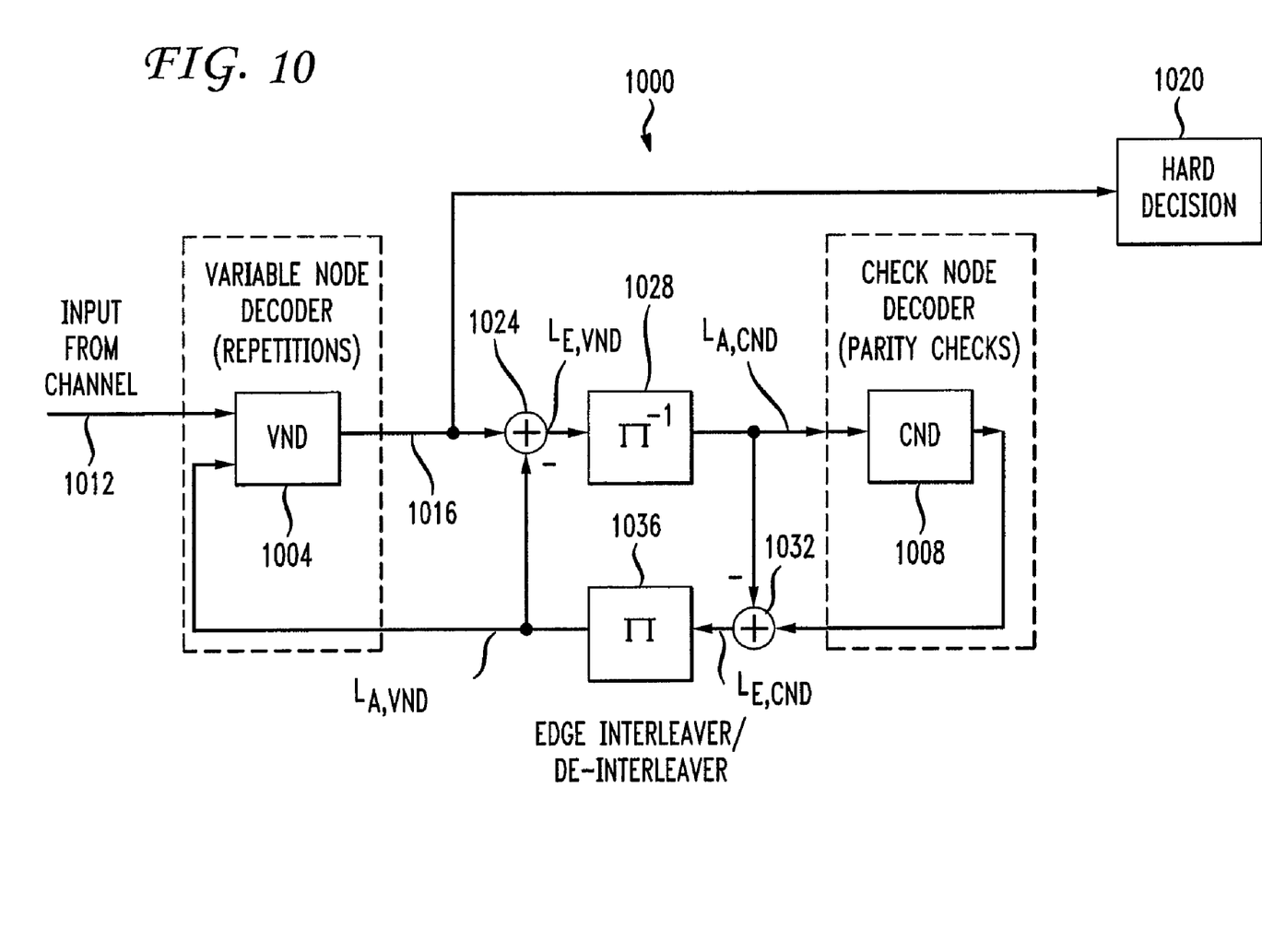
FIG. 10 is a block diagram of a decoding module for iterative decoding of LDPC codes in accordance with an embodiment of the invention.

FIG. 10 is a block diagram of an embodiment of a decoding module 1000 for iterative decoding of LDPC codes over AWGN channels. The decoding module 1000 includes a variable node decoder (VND) 1004 and a check node decoder (CND) 1008. The VND 1004 is a decoder of repetition codes. The VND 1004 receives input from a channel 1012 and produces output 1016. Output 1016 generates a hard decision 1020. Output 1016 is also provided as input into a summing block 1024 and then to an edge de-interleaver 1028. The edge interleaver 1028 is an interleaver represented by the edges connecting the variable nodes and check nodes. For example, there are ten edges coming out of the check nodes, and these edges can be ordered as "1, 2 . . . 10". The edge interleaver changes the orders of these edges according to a random pattern. After interleaving, the edges' order are changed to "10, 5, 2 . . . 1". The edge de-interleaver performs the inverse operation so that the edges' orders are restored to the original ones "1, 2 . . . , 10". The output of the edge de-interleaver 1028 is transmitted to the CND 1008. The CND 1008 is a decoder of single parity-check codes.

The output of the edge de-interleaver 1028 is also transmitted to another summing module 1032. The output of the edge de-interleaver 1028 is subtracted from the output of the CND 1008 by the summing module 1032. The output of the summing module 1032 is then input into an edge interleaver 1036. The output of the edge interleaver 1036 is transmitted to the summing module 1024 (for subtraction) and to the VND 1004 as feedback. In one embodiment, the computer described above performs one or more of the functions of the decoding module 1000.

In more detail of the variable node decoding process, the VND output log-likelihood ratio (LLR) corresponding to a node with degree i is, in general, given by:

$$L_{E,V}(i) = L_0 + \sum_{j \neq i} L_{A,V}(j),$$

where $L_0 \sim N(m_0, \sigma_0^2)$ denotes the VND input LLR coming from channel, $m_0$ is the mean (the mean $m_0 = 2\gamma_0$ depends on the received SNR $\gamma_0$ over the AWGN channel), $\sigma_0^2$ is the channel noise variance. $L_{E,V}$ represents the extrinsic log-likelihood ratio (LLR) of the variable node output. $L_{A,V}$ represents the extrinsic LLR of the variable node input. $L_{E,V}(i)$ in region-1 and region-2 are different because $\gamma_1 \neq \gamma_2$, as shown above in equations (7) and (8). The quantities with superscript (I) are denoted as those for region-I, I=1, 2. In particular, the VND output LLRs of a node with degree i for region-1 and region-2 are given, respectively, by $$L^{(1)}_{E,V}(i) = L^{(1)}_0 + \sum_{j \neq i} L^{(1)}_{A,V}(j) \text{ and } L^{(2)}_{E,V}(i) = L^{(2)}_0 + \sum_{j \neq i} L_{A,V}(j) \quad (14)$$

where $L_0^{(1)} \sim N(m_0^{(1)}, \sigma_0^{(1)})$ denotes the detector output of equation (2) and $L_0^{(2)} \sim N(m_0^{(2)}, \sigma_0^{(2)})$ denotes the detector output of equation (6). $m_0^{(1)} = 2\gamma_1$ and $m_0^{(2)} = 2\gamma_2$; $L_{A,V}^{(\iota)}(j)$ are identically independently distributed symmetric Gaussian random variables, i.e., $L_{A,V}^{(\iota)}(j) \sim N(m_C^{(\iota)}, 2m_C^{(\iota)})$, I=1, 2. Then, $L_{E,V}^{(\iota)}(i)$, $\iota = 1, 2$ can be well approximated by a symmetric Gaussian random variable, i.e., $$L^{(l)}_{E,V}(i) \sim N(\underbrace{m_0^l + (i-1)m_C^{(l)}, 2(m_0^{(l)} + (i-1)m_C^{(l)})}_{m_V^{(l)}(i)}) = \quad (15)$$

$$N(m_V^{(l)}(i), 2m_V^{(l)}(i)).$$

Thus, the averaged VND output LLR per edge has the Gaussian mixture density function:

$$f_V^{(l)} = \sum_i \lambda_i^{(l)} N(m_v^{(l)}(i), 2m_v^{(l)}(i)) = N(m_v^{(l)}, 2m_v^{(l)}), \; l = 1, 2, \quad (16)$$

where $\{\lambda_i^{(\iota)}\}_i$ denotes the variable edge distribution in region-I defined above.

Check Node Decoding Process

The CND output LLR of a node with degree i is, in general, given by $$L_{E,C}(i) = 2\text{argtanh}\left(\prod_{j \neq i} \tanh\left(\frac{L_{A,C}(j)}{2}\right)\right), \quad (17)$$

where $L_{A,C}(j)$ denotes the CND input LLRs coming from the VND output edges given by equation (14) above. The following equation results from taking expectation over each side of equation (17):

$$E\left\{\tanh\left(\frac{L_{E,C}(i)}{2}\right)\right\} = E\left\{\prod_{j \neq i} \tanh\left(\frac{L_{A,C}(j)}{2}\right)\right\}$$

$$= \prod_{j \neq i} E\left\{\tanh\left(\frac{L_{A,C}(j)}{2}\right)\right\}$$

where the second equality follows the fact that $L_{A,C}(j)$ is independently distributed. It should be noted that $L_{E,C}(j)$ in region-1 and region-2 also have different density functions because $f_V^{(1)} \neq f_V^{(2)}$ as revealed in equations (15) and (16) above. Then, the CND output LLRs in region-1 satisfy the equation below:

$$E\left\{\tanh\left(\frac{L^{(1)}_{E,C}(i)}{2}\right)\right\} = \prod_{k \neq i} E\left\{\tanh\left(\frac{L^{(1)}_{A,C}(k)}{2}\right)\right\} \prod_l E\left\{\tanh\left(\frac{L^{(2)}_{A,C}(l)}{2}\right)\right\}$$

$$= E\left\{\tanh\left(\frac{L^{(1)}_{A,C}(k)}{2}\right)\right\}^{d_{i,1}-1} E\left\{\tanh\left(\frac{L^{(2)}_{A,C}(l)}{2}\right)\right\}^{d_{i,2}}$$

i.e., $$\psi(m_C^{(1)}(i)) = [\psi(m_V^{(1)})]^{d_{i,1}-1} [\psi(m_V^{(2)})]^{d_{i,2}}$$

where $\psi(x) \underline{\underline{\Delta}} E\{\tanh(y/2)\}$ with $y \sim N(x, 2x)$. The second equality comes from the fact that $L_{A,C}^{(\iota)}(j)$ are within region-I; $d_{i,\iota}$, I=1, 2, denotes the number of CND input edges coming from region-I, which is defined as $$d_{i,l} = iP_l \text{ with } P_l \triangleq \frac{ia_i \pi_l(i)}{\sum_{j=2}^{D_V} ja_j}$$

denoting the proportion of the number of edges falling within region-I. Furthermore, using the mixture Gaussian density function in equation (16), the mean of CND output LLRs in region-1 is given by:

$$m_C^{(1)}(i) = \psi^{-1}\left(\left[\psi\left(\sum_j \lambda_j^{(1)} m_V^{(1)}(i)\right)\right]^{d_{i,1}-1} \left[\psi\left(\sum_j \lambda_j^{(2)} m_V^{(2)}(i)\right)\right]^{d_{i,2}}\right) \quad (18)$$

Similarly, the mean of the CND output LLRs within region-2 can then be written as:

$$m_C^{(2)}(i) = \psi^{-1}\left(\left[\psi\left(\sum_j \lambda_j^{(1)} m_v^{(1)}(i)\right)\right]^{d_{i,1}} \left[\psi\left(\sum_j \lambda_j^{(2)} m_v^{(2)}(i)\right)\right]^{d_{i,2}-1}\right) \quad (19)$$

Using equations (18) and (19) above, the mixture Gaussian density functions of CND outputs are given by $$f_C^{(l)} = \sum_i \rho_i N(m_C^{(l)}(i), 2m_C^{(l)}(i)) = N(m_C^{(l)}, 2m_C^{(l)}), \quad (20)$$

$$l = 1, 2,$$

where $\{\rho_i\}_i$ denotes the overall edge distribution of the check nodes.

Iterative Algorithm for Ensemble Performance Prediction

Figure 11:
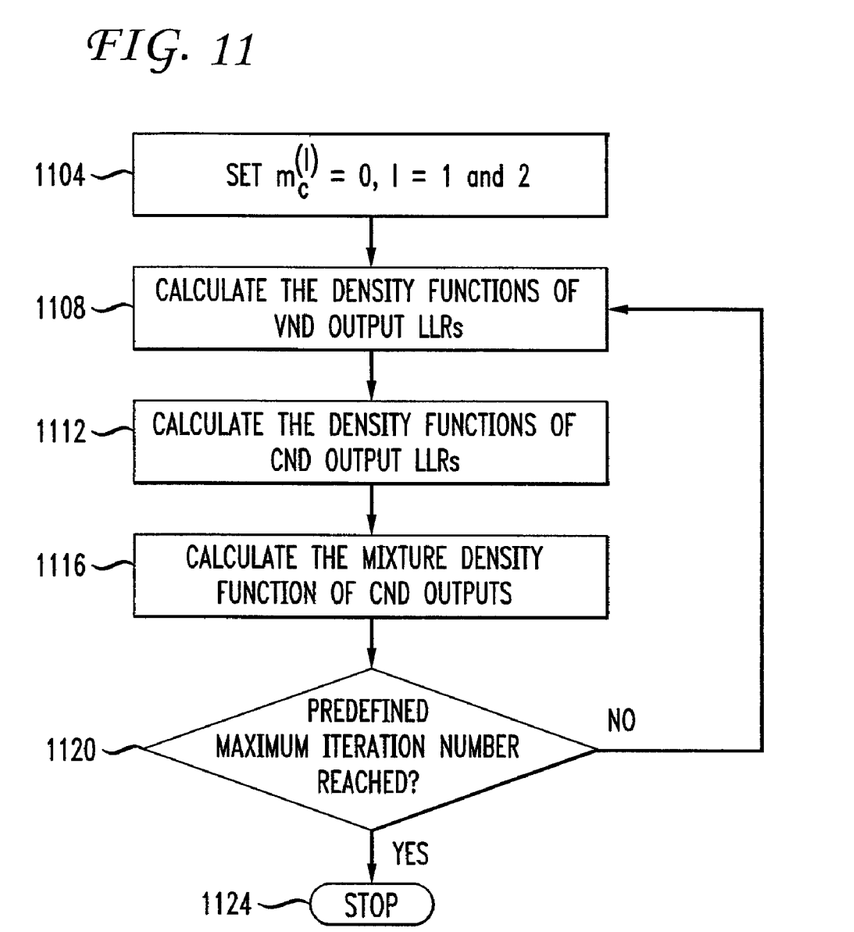
FIG. 11 is a flowchart showing the steps performed by the processor to predict the ensemble performance of the half-duplex relay codes in accordance with an embodiment of the invention.

FIG. 11 is a flowchart showing the steps performed by the processor to predict the ensemble performance of the half-duplex relay codes. The mean of CND output LLRs is set in region-I to zero, where I equals 1 and 2 in step 1104. The density functions of VND output LLRs (i.e., $m_v^t(i)$) are then calculated (e.g., using equation (15)) in step 1108. The density functions of CND output LLRs (i.e., $m_C^{(t)}(i)$) are then calculated (e.g., using equations (18) and (19)) in step 1112. The mixture density function of CND outputs (i.e., $m_C^{(t)}$) are then calculated (e.g., using equation (20)) in step 1116. The processor then determines, in step 1120, whether a predefined maximum iteration number has been reached. If so, the iteration is stopped in step 1124. If not, then the process returns to step 1108 and repeats.

Optimization of Half-Duplex Relay Code Ensemble

Figure 12:
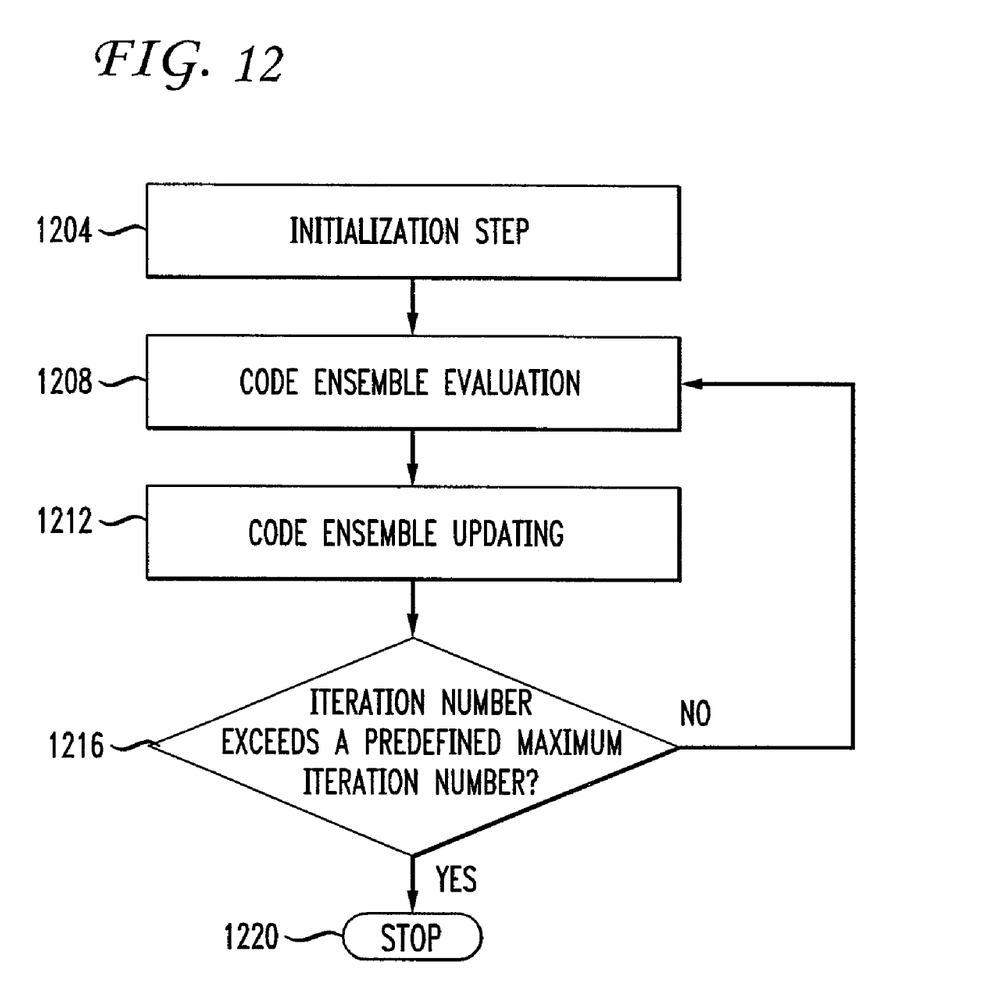
FIG. 12 is a flowchart of an ensemble optimization procedure performed by the processor in accordance with an embodiment of the invention.

FIG. 12 is a flowchart of an ensemble optimization procedure that the processor can perform. The processor first performs an initialization step in step 1204. In particular, given the original LDPC code with a rate of $R_1$ and an ensemble of $\{\{\lambda_{i,1}\}_{i=1}^{D_V^{(1)}}, \{\rho_{j,1}\}_{j=1}^{D_C^{(1)}}\}$, the processor generates N half-duplex relay codes, each of which has a rate of $R_2$ and an ensemble of $$C(n) = \{\{\lambda_{i,2}^{(1)}(n), \lambda_{i,2}^{(2)}(n)\}_{i=1}^{D_V^{(2)}}, \{\rho_{j,2}(n)\}_{j=1}^{D_C^{(2)}}\},$$
$$n = 1, 2, \ldots, N.$$

A code ensemble evaluation is then performed in step 1208. In particular, each code ensemble $C(n)$ is then evaluated (e.g., using the steps of FIG. 11), where $1 \leq n \leq N$. The optimum code ensemble $C^* = \arg\max_{1 \leq i \leq N} m_{dec}(n)$ is then found, where $C^* = \{\{\lambda^*_{i,2}, \lambda^*_{i,2}\}_{i=1}^{D_V^{(2)}}, \{\rho^*_{j,2}\}_{j=1}^{D_C^{(2)}}\}$, and $m_{dec}(n)$ is the mean of the decoder output for $C(n)$. Code ensemble updating is then performed in step 1212. In particular, $\tilde{N}$ code ensembles are randomly chosen out of $\{C(n)\}_{n=1}^N$, which are denoted by $\tilde{C}(k) = \{\{\tilde{\lambda}_{i,2}(k), \tilde{\lambda}_{i,2}(k)\}_{i=1}^{D_V^{(2)}}, \{\tilde{\rho}_{j,2}(k)\}_{j=1}^{D_C^{(2)}}\}$, $k = 1, 2, \ldots, \tilde{N}$. The n-th code ensemble is then updated by $$C(n) = C^* + \alpha \sum_{k=1}^{\tilde{N}} (-1)^{k-1} \tilde{C}(k),$$

where $\alpha < 1$ is the step size. In one embodiment, this step is repeated to update all code ensembles $C(n)$, $1 \leq i \leq N$.

The processor then determines, in step 1216, whether the iteration number exceeds a predefined maximum iteration number. If so, the process is stopped in step 1220. If not, then the processor returns the process to step 1208 and repeats the process.

In one embodiment, in step 1204, to generate the half-duplex relay code ensembles using the original LDPC code ensemble, the processor analyzes some additional rate-compatible constraints. For example, the overall edge distribution and the corresponding overall node perspective of $w_2$, $\{\lambda_{i,2}, a_{i,2}\}_{i=1}^{D_V^{(2)}}$ and $\{\rho_{j,2}, b_{j,2}\}_{j=1}^{D_C^{(2)}}$, may satisfy the constraints below:

$$\begin{cases} \lambda_{2,2} = 1 - \sum_{j=3}^{D_V^{(2)}} \lambda_{j,2}, \text{ and } \rho_{2,2} = 1 - \sum_{j=3}^{D_C^{(2)}} \rho_{j,2} \\ \lambda_{D_V^{(2)},2} = \dfrac{\dfrac{R_2}{2}\sum\limits_{j=3}^{D_C^{(2)}}\left(\dfrac{1}{j}-\dfrac{1}{2}\right) - (1-R_2)\sum\limits_{j=3}^{D_V^{(2)}-1}\left(\dfrac{1}{j}-\dfrac{1}{2}\right)}{(1-R_2)\left(\dfrac{1}{D_V^{(2)}}-\dfrac{1}{2}\right)}, \\ a_{i,2} = \dfrac{\dfrac{\lambda_{i,2}}{i}}{\sum\limits_{j=2}^{D_V^{(2)}}\dfrac{\lambda_{j,2}}{j}} \text{ and } b_{i,2} = \dfrac{\dfrac{\rho_{i,2}}{i}}{\sum\limits_{j=2}^{D_C^{(2)}}\dfrac{\rho_{j,2}}{j}}. \end{cases} \quad (21)$$

Referring again to the parity-check matrix $H_2$ of FIG. 4, since O is an all-zero sub-matrix, the overall check node perspective $\{b_{i,2}\}_{i=1}^{D_C^{(2)}}$ corresponding to $H_2$ and the overall check node perspective $\{b_{i,1}\}_{i=1}^{D_C^{(1)}}$ corresponding to $H_1$ should satisfy the constraints $b_{i,2} M_2 \geq b_{i,1} M_1$, $i = 2, 3, \ldots, D_C^{(1)}$, i.e., $$b_{i,2} \geq \frac{M_1}{M_2} b_{i,1} = \frac{(1-R_1)N_1}{(1-R_2)N_2} b_{i,1} = \frac{(1-R_1)R_2}{(1-R_2)R_1} b_{i,1}, \quad (22)$$
$$i = 2, 3, \ldots, D_C^{(1)}$$

where the first equality follows the fact $$1 - R_i = \frac{M_i}{N_i}$$

and the second equality comes from the inherent rate-compatible property, $R_1 N_1 = N_1 - M_1 = N_2 - M_2 = R_2 N_2$. Then, using equation (21), the node perspective constraints can be equivalently transformed into the corresponding edge distribution constraints $$\frac{\rho_{i,2}/i}{\sum\limits_{j=2}^{D_C^{(2)}} \rho_{j,2}/j} \geq \Gamma b_{i,1}, i = 2, 3, \ldots D_C^{(1)}, \quad (23)$$

i.e., $\dfrac{\rho_{i,2}}{i} \geq \Gamma b_{i,1} \sum\limits_{j=2}^{D_C^{(2)}} \dfrac{\rho_{j,2}}{j} = \Gamma b_{i,1}\left[\dfrac{1}{2} + \sum\limits_{j=3}^{D_C^{(2)}} \rho_{j,2}\left(\dfrac{1}{j}-\dfrac{1}{2}\right)\right]$, $i = 2, 3, 4, \ldots, D_C^{(1)}$.

For the case of $i=2$ in equation (23), using $$\rho_{2,2} = 1 - \sum_{j=3}^{D_C^{(2)}} \rho_{j,2}$$

in equation (21), results in:

$$\frac{\rho_{2,2}}{2} = \frac{1 - \sum_{j=3}^{D_C^{(2)}} \rho_{j,2}}{2} \geq \frac{\Gamma b_{2,1}}{2} + \Gamma b_{2,1}\left[\sum_{j=3}^{D_C^{(2)}} \rho_{j,2}\left(\frac{1}{j} - \frac{1}{2}\right)\right], \quad (24)$$

i.e., $\frac{1 - \Gamma b_{2,1}}{2} \geq \sum_{j=3}^{D_C^{(2)}} \frac{\rho_{j,2}}{2} + \Gamma b_{2,1}\left[\sum_{j=3}^{D_C^{(2)}} \rho_{j,2}\left(\frac{1}{j} - \frac{1}{2}\right)\right].$ Further, the overall variable node perspective $\{a_{i,2}\}_{i=1}^{D_V^{(2)}}$ corresponding to $H_2$ and $\{a_{i,1}\}_{i=1}^{D_V^{(1)}}$ corresponding to $H_1$ satisfy the constraints $$\sum_{k=l}^{D_V^{(2)}} a_{k,2} N_2 \geq \sum_{k=l}^{D_V^{(1)}} a_{k,1} N_1, \quad (25)$$

i.e., $\sum_{k=l}^{D_V^{(2)}} a_{k,2} \geq \frac{N_1}{N_2} \sum_{k=l}^{D_V^{(1)}} a_{k,1} = \frac{R_2}{\frac{R_1}{V}} \sum_{k=l}^{D_V^{(2)}} a_{k,1}, l = 2, 3, \ldots, D_V^{(1)},$ Then, using equation (21), the variable node constraints of equation (25) can be equivalently transformed into the variable edge distribution constraints $$\sum_{k=l}^{D_V^{(2)}} \frac{\lambda_{k,2}/k}{\sum_{j=1}^{D_V^{(2)}} \lambda_{j,2}/j} \geq Y \sum_{k=l}^{D_V^{(1)}} a_{k,1}, l = 2, 3, \ldots D_V^{(1)}, \quad (26)$$

i.e., $\sum_{k=l}^{D_V^{(2)}} \frac{\lambda_{k,2}}{k} \geq \left(Y\sum_{k=l}^{D_V^{(1)}} a_{k,1}\right)\left(\sum_{k=l}^{D_V^{(2)}} \frac{\lambda_{k,2}}{k}\right) = \left(Y\sum_{k=l}^{D_V^{(2)}} a_{k,1}\right)\left(\frac{\sum_{k=2}^{D_C^{(2)}} \frac{\rho_{k,2}}{k}}{1 - R_2}\right),$ i.e., $\sum_{k=l}^{D_V^{(2)}} \frac{\lambda_{k,2}}{k} \geq \left(Y\sum_{k=l}^{D_V^{(1)}} a_{k,1}\right)\left(\frac{\frac{1}{2} + \sum_{k=3}^{D_C^{(2)}} \rho_{k,2}\left(\frac{1}{k} - \frac{1}{2}\right)}{1 - R_2}\right)$ Thus, in the initialization step (step 1204) of FIG. 12, the constraints for generating half-duplex relay code ensembles based on the given code ensemble of $w_1$ can be written as shown in equations (23), (24), and (26). In the code ensemble evaluation step (i.e., step 1208 of FIG. 12), the algorithm described in FIG. 11 is employed to predict the performance of each half-duplex relay code ensemble $C(n)=\{\{\lambda_{i,2}^{(1)}(n), \lambda_{i,2}^{(2)}(n)\}_{i=2}^{D_V^{(2)}}, \{\rho_{i,2}(n)\}_{i=2}^{D_C^{(2)}}\}$. Hence, $\{\lambda_{i,2}^{(1)}(n), \lambda_{i,2}^{(2)}(n)\}_{i=2}^{D_V^{(2)}}$ is needed for the given overall code ensemble $\{\{\lambda_{i,2}\}_i, \{\rho_{j,2}\}_j\}$. As described above for a given overall edge distribution $\{\lambda_{i,2}, \rho_{j,2}\}_{i,j}$, the edge distribution $\{\lambda_{i,2}^{(1)}(n), \lambda_{i,2}^{(2)}(n)\}_{i=2}^{D_V^{(2)}}$ defined in equation (10) depends on the node probability set $\{\pi_1(i), \pi_2(i)\}_i$, which is not unique and corresponds to a specific structure of the parity-check matrix.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A system for determining a low-density parity check (LDPC) code design for a half-duplex relay channel comprising:
   a variable node decoder configured to calculate variable node density functions $f_V^{(1)}(i)$ and $f_V^{(2)}(i)$ within a first codeword region and a second codeword region, respectively, said variable node density functions $f_V^{(1)}(i)$ and $f_V^{(2)}(i)$ being density functions of output edges of variable nodes with degree i within said first codeword region and said second codeword region, respectively;
   a check node decoder configured to calculate check node density functions $f_C^{(1)}(j)$ and $f_C^{(2)}(j)$ within said first codeword region and said second codeword region, respectively, said check node density functions $f_C^{(1)}(j)$ and $f_C^{(2)}(j)$ being density functions of output edges of check nodes with degree j within said first codeword region and said second codeword region, respectively;
   a processor configured to calculate mixture density functions of output check edges connecting variable nodes in said first codeword region and said second codeword region to determine an LDPC code design,
   wherein, if a signal to noise ratio (SNR) of said first codeword region is different than a signal to noise ratio of said second codeword region, then
   $f_V^{(1)}(i) \neq f_V^{(2)}(i)$ for each i and $f_C^{(1)}(j) \neq f_C^{(2)}(j)$ for each j.

2. The system of claim 1 wherein said variable node decoder is configured to calculate said variable node density functions and said check node decoder is configured to calculate said check node density functions using a probability density function of a symmetric Gaussian distribution.

3. The system of claim 1 wherein said variable node density function $f_V^{(1)}(i)$ is proportional to $$N\underbrace{(m_0^{(l)} + (i-1)m_C^{(l)}, 2(m_0^{(l)} + (i-1)m_C^{(l)}))}_{m_V^{(l)}(i)} = N(m_V^{(l)}(i), 2m_V^{(l)}(i))$$

where $I=1, 2$, $N(u,v)$ represents the Gaussian distribution with a mean of "u" and a variance of "v", $m_0$ represents a first mean value, and $m_c$ represents a second mean value.

4. The system of claim 1 wherein said check node density function $f_C^{(1)}(j)$ is proportional to $(Nm_C^{(1)}(j), 2m_C^{(1)}(j))$, wherein $$m_C^{(l)}(i) = \psi^{-1}\left(\left[\psi\left(\sum_j \lambda_j^{(1)} m_V^{(1)}(i)\right)\right]^{d_{i,1}-1}\left[\psi\left(\sum_j \lambda_j^{(2)} m_V^{(2)}(i)\right)\right]^{d_{i,2}}\right)$$

and $\psi(x) \underline{\underline{\Delta}} E\{\tanh(y/2)\}$ with $y \sim N(x, 2x)$.

5. The system of claim 1 wherein said check node density function $f_C^{(2)}(j)$ is proportional to $(Nm_C^{(2)}(j), 2m_C^{(2)}(j))$, wherein $$m_C^{(2)}(i) = \psi^{-1}\left(\left[\psi\left(\sum_j \lambda_j^{(1)} m_V^{(1)}(i)\right)\right]^{d_{i,1}} \left[\psi\left(\sum_j \lambda_j^{(2)} m_V^{(2)}(i)\right)\right]^{d_{i,2}-1}\right)$$

and $\psi(x) \underline{\underline{\Delta}} E\{\tanh(y/2)\}$ with $y \sim N(x, 2x)$.

6. The system of claim 1 wherein said processor is configured to calculate said mixture density functions of output check edges by determining $$f_C^{(l)} = \sum_i \rho_i N(m_C^{(l)}(i), 2m_C^{(l)}(i)) = N(m_C^{(l)}, 2m_C^{(l)}), l = 1, 2,$$

where $\{\rho_i\}_i$ denotes the overall edge distribution of the check nodes.

7. The system of claim 1 wherein said processor is configured to at least one of determine if a predefined maximum iteration number is reached, perform an initialization step for said density functions, evaluate a code ensemble, and update a code ensemble.

8. A system for determining a low-density parity check (LDPC) code design for a half-duplex relay channel comprising:
  means for calculating variable node density functions $f_V^{(1)}(i)$ and $f_V^{(2)}(i)$ within a first codeword region and a second codeword region, respectively, said variable node density functions $f_V^{(1)}(i)$ and $f_V^{(2)}(i)$ being density functions of output edges of variable nodes with degree i within said first codeword region and said second codeword region, respectively;
  means for calculating check node density functions $f_C^{(1)}(j)$ and $f_C^{(2)}(j)$ within said first codeword region and said second codeword region, respectively, said check node density functions being density functions of output edges of check nodes with degree j within said first codeword region and said second codeword region, respectively; and
  means for calculating mixture density functions of output check edges connecting variable nodes in said first codeword region and said second codeword region to determine an LDPC code design,
  wherein, if a signal to noise ratio (SNR) of said first codeword region is different than a signal to noise ratio of said second codeword region, then
  $f_V^{(1)}(i) \neq f_V^{(2)}(i)$ for each i and $f_C^{(1)}(j) \neq f_C^{(2)}(j)$ for each j.

9. The system of claim 8 wherein said means for calculating said variable node density functions and said check node density functions each further comprise means for using a probability density function of a symmetric Gaussian distribution.

10. The system of claim 8 wherein said variable node density function $f_V^{(1)}(i)$ is proportional to $$N(\underbrace{m_0^{(l)} + (i-1)m_C^{(l)}}_{m_V^{(l)}(i)}, 2(m_0^{(l)} + (i-1)m_C^{(l)})) = N(m_V^{(l)}(i), 2m_V^{(l)}(i)).$$

where $l=1, 2$, $N(u,v)$ represents the Gaussian distribution with a mean of "u" and a variance of "v", $m_0$ represents a first mean value, and $m_c$ represents a second mean value.

11. The system of claim 8 wherein said check node density function $f_C^{(1)}(j)$ is proportional to $(Nm_C^{(1)}(j), 2m_C^{(1)}(j))$, wherein $$m_C^{(1)}(i) = \psi^{-1}\left(\left[\psi\left(\sum_j \lambda_j^{(1)} m_V^{(1)}(i)\right)\right]^{d_{i,1}-1} \left[\psi\left(\sum_j \lambda_j^{(2)} m_V^{(2)}(i)\right)\right]^{d_{i,2}}\right)$$

and $\psi(x) \underline{\underline{\Delta}} E\{\tanh(y/2)\}$ with $y \sim N(x, 2x)$.

12. The system of claim 8 wherein said check node density function $f_C^{(2)}(j)$ is proportional to $(Nm_C^{(2)}(j), 2m_C^{(2)}(j))$, wherein $$m_C^{(2)}(i) = \psi^{-1}\left(\left[\psi\left(\sum_j \lambda_j^{(1)} m_V^{(1)}(i)\right)\right]^{d_{i,1}} \left[\psi\left(\sum_j \lambda_j^{(2)} m_V^{(2)}(i)\right)\right]^{d_{i,2}-1}\right)$$

and $\psi(x) \underline{\underline{\Delta}} E\{\tanh(y/2)\}$ with $y \sim N(x, 2x)$.

13. The system of claim 8 wherein said means for calculating said mixture density functions of output check edges further comprises means for determining $$f_C^{(l)} = \sum_i \rho_i N(m_C^{(l)}(i), 2m_C^{(l)}(i)) = N(m_C^{(l)}, 2m_C^{(l)}), l = 1, 2,$$

where $\{\rho_i\}_i$ denotes the overall edge distribution of the check nodes.

14. The system of claim 8 further comprising at least one of means for determining if a predefined maximum iteration number is reached, means for performing an initialization step for said density functions, means for evaluating a code ensemble, and means for updating a code ensemble.

* * * * *